US005170067A

United States Patent [19]

Baum et al.

[11] Patent Number: 5,170,067

[45] Date of Patent: Dec. 8, 1992

[54] PLUG INSERTABLE INTO A VEHICLE CIGARETTE LIGHTER RECEPTACLE AND HAVING ELECTRONIC COMPONENTS AND A PRINTED CIRCUIT BOARD THEREIN

[75] Inventors: Roger N. Baum, Tempe; Donald E. Gorney; Robert N. Nelson, both of Scottsdale, all of Ariz.

[73] Assignee: Unitech Industries, Inc., Huntington Beach, Calif.

[21] Appl. No.: 618,383

[22] Filed: Nov. 27, 1990

[51] Int. Cl.[5] ........................ H05K 5/02; H01R 17/18; B60L 1/00

[52] U.S. Cl. .................................. 307/10.1; 361/394; 361/399; 439/668

[58] Field of Search ............... 307/10.1; 361/392, 394, 361/399, 386, 389; 439/668, 669, 638, 620, 76, 221, 912; 455/128

[56] References Cited

U.S. PATENT DOCUMENTS

| | | | |
|---|---|---|---|
| 3,145,329 | 8/1964 | Deakin et al. | 439/669 |
| 3,377,610 | 4/1968 | Busch et al. | 429/620 |
| 3,905,920 | 9/1975 | Botcharoff | 250/536 |
| 4,261,630 | 4/1981 | Knappenberger | 439/912 |
| 4,286,262 | 8/1981 | Wahl | 340/694 |
| 4,322,122 | 3/1982 | Schwartz et al. | 439/621 |
| 4,604,529 | 8/1986 | Grimsley et al. | 307/10.1 |
| 4,972,172 | 11/1990 | McLaughlin | 340/331 |
| 5,034,846 | 7/1991 | Hodge et al. | 439/620 |

*Primary Examiner*—A. D. Pellinen
*Assistant Examiner*—Richard Elms
*Attorney, Agent, or Firm*—Cahill, Sutton & Thomas

[57] ABSTRACT

A plug insertable into the cigarette lighter receptacle of a motor vehicle has electronic component circuitry therein for shifting the voltage of the electrical energy extracted from the vehicle. A leaf spring connector forming a part of the plug is employed to heat sink a heat generating component of the electrical circuitry in the plug.

2 Claims, 1 Drawing Sheet

PLUG INSERTABLE INTO A VEHICLE CIGARETTE LIGHTER RECEPTACLE AND HAVING ELECTRONIC COMPONENTS AND A PRINTED CIRCUIT BOARD THEREIN

TECHNICAL FIELD

This invention is concerned with supplying from a motor vehicle electrical system direct current at a required voltage to power or charge the battery of a portable appliance.

BACKGROUND ART

There are numerous portable appliances in use today which may conveniently be powered or have their batteries charged from a motor vehicle electrical system. Such appliances include cellular telephones, two-way radios, video camcorders, and video games.

It is fairly common practice to plug into the cigarette lighter receptacle in the motor vehicle to obtain electrical energy from the vehicle's electrical system to power these appliances. This energy may be used to directly power the appliances, thereby eliminating the battery pack otherwise used for power. Or the energy may be employed to charge the batteries in the pack.

Nearly all motor vehicles in use today have 12 volt electrical systems. However, different appliances are designed to be powered at different voltage levels, and seldom require exactly 12 volts. Moreover, different types of battery packs, say nickel/cadmium versus lead-/acid, often require different charging voltages, even though rated for the same output voltage.

As a consequence of these different requirements, it is usually necessary to shift the 12 volt current obtained from the vehicle to another voltage before it can be utilized to power or recharge an appliance. Separate voltage shifting units have been devised for this purpose. It has also been proposed that the voltage shifting unit be incorporated into the power pack itself. Another approach has been to attach the voltage shifting unit to the electrical plug which is inserted into the cigarette lighter receptacle. A disadvantage of the latter arrangement is that other vehicle components in the vicinity of the cigarette lighter can interfere with insertion of the plug with the voltage shifting unit attached.

DISCLOSURE OF THE INVENTION

This invention makes it possible to position significant portions of electrical components of the voltage shifting circuitry within the plug that goes into the cigarette lighter receptacle. The remaining electronic components can be housed in the handle for the plug, which is only slightly larger in diameter than the plug and is, therefore, unlikely to encounter interference from surrounding vehicle components.

One discovery that enables the voltage shifting components to be incorporated into the plug is that any heat generating component or components can be heat sinked through one of the spring metal connectors employed to ground the plug in the receptacle and to hold the plug in the receptacle.

BRIEF DESCRIPTION OF THE DRAWINGS

The invention is described in greater detail hereinafter by reference to the accompanying drawings, wherein.

BEST MODES FOR CARRYING OUT THE INVENTION

Figure 1:
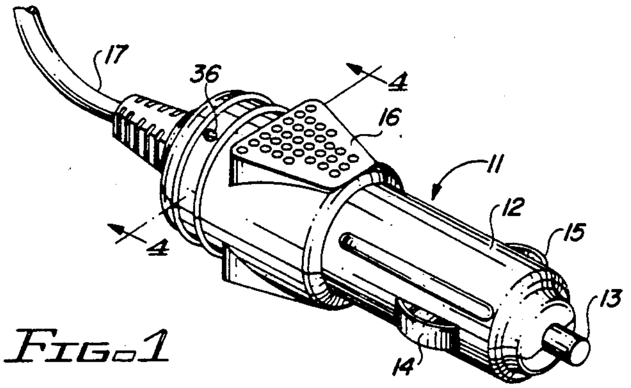
FIG. 1 is a perspective view of an electrical plug possessing voltage shifting characteristics according to this invention.

Referring particularly to FIG. 1, reference numeral 11 designates generally an electrical plug adapted to be plugged into the cigarette lighter receptacle of a motor vehicle for the purpose of extracting electrical energy from the vehicle's electrical system. Plug 11 has a generally cylindrical body 12 sized to fit snugly within the receptacle. At the forward end of plug body 12 there is provided a spring-loaded axial contact 13 for engagement with the positive contact in the receptacle. The plug body 12 also has portions of leaf spring contacts 14 and 15 protruding from opposite sides thereof and providing ground contact with the receptacle. The spring contacts 14 and 15 also serve to hold the plug 11 in position within the receptacle.

Plug 11 further comprises a handle 16 at the rear of the plug body 12 which can be grasped between the thumb and the finger to manipulate the plug into and out of the receptacle. An electrical lead 17 protruding from the end of the plug handle 16 is employed to conduct current at a desired voltage to a cellular phone or other appliance or a battery pack for the same. Because the voltage requirements of the appliances served through lead 17 are different from the voltage to which contacts 13, 14 and 15 are subjected, voltage of the current passing through plug 11 must be shifted.

Figure 2:
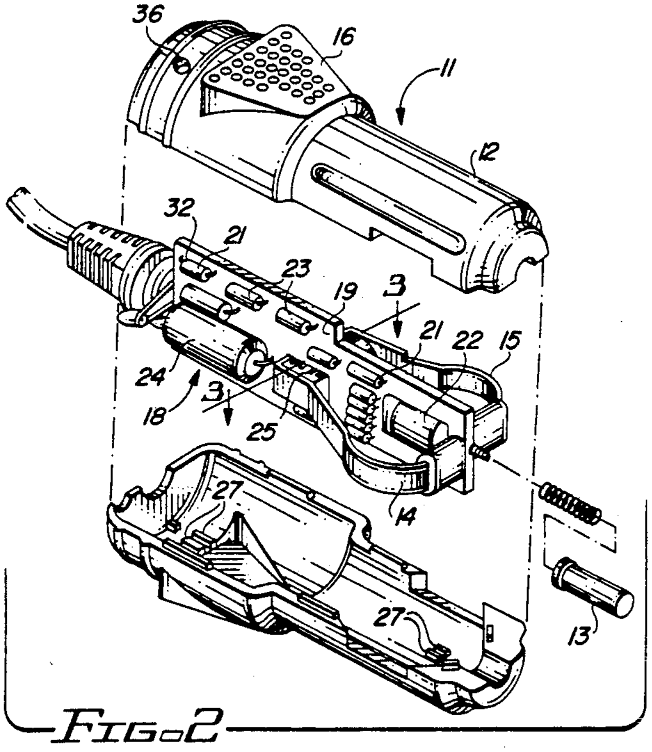
FIG. 2 is an exploded perspective view of the plug shown in FIG. 1, revealing the electronic components therein.
Figure 5:
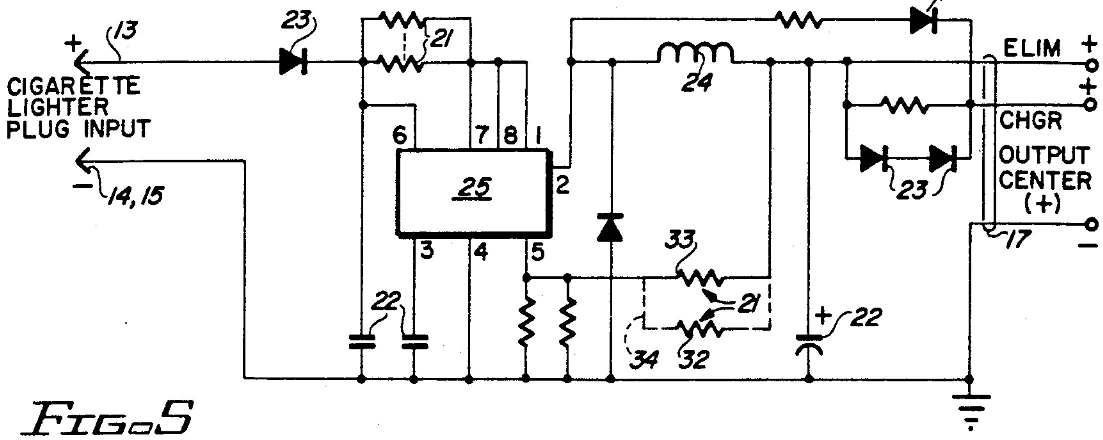
FIG. 5 is a schematic drawing of a voltage shifting circuit employed in the invention.

Referring now to FIG. 2, the body of plug 11 is preferably molded from plastic in two halves, permitting assembly therein of voltage shifting circuitry, designated generally by reference numeral 18. This circuitry includes a printed circuit board 19 having a plurality of electronic components mounted thereon and therein. Among those components are a plurality of resistors 21, several capacitors 22. several diodes 23, a choke 24, and a switching controller chip 25. A schematic of a typical voltage shifting circuit employing these components appears as FIG. 5 in the drawings.

Circuit board 19 is positioned within plug 11 by means of tabs 27 molded on the inner surface of the plug 12 and plug handle 16 (see FIG. 2). With the two halves of the plug 11 cemented together, the circuit board 19 and the components thereon are held snugly in place in the plug.

It will be appreciated that certain components in the voltage shifting circuitry 18 of this invention generate heat when electrical current is flowing through the circuit. This is particularly true for the switching controller chip 25. And this device cannot operate efficiently unless its temperature is kept below a certain maximum value. It is therefore desirable to heat sink this chip 25 to conduct away heat that is generated therein.

Figure 3:
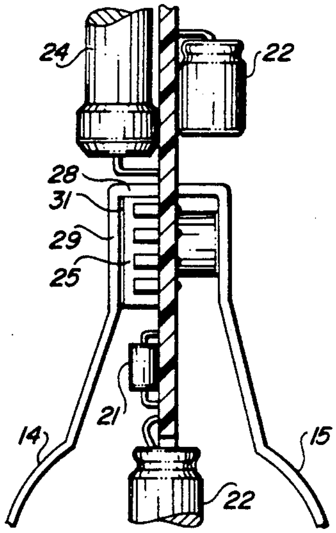
FIG. 3 is an enlarged fragmentary sectional view taken as indicated by line 3—3 in FIG. 2.

In accordance with this invention, leaf spring contact 14 is employed as a heat sink for chip 25. This arrangement is best illustrated in FIG. 3. As shown there, the end 28 of contact 14 is mounted in circuit board 19 in such a manner that a flat section 29 of the contact passes in close proximity to the face of chip 25. With this arrangement, heat generated in chip 25 is dissipated to and conveyed away from the chip 25 by the spring contact 14. Spring contacts of this character are usually made from chrome plated beryllium copper and thus are excellent heat conductors. If desired, the contact 14 may be cemented to the chip by a heat conducting adhesive illustrated at 31.

It will also be appreciated that because spring contact 14 is in firm contact with the metallic cigarette receptacle, the latter can also assist in dissipating heat from the chip 25. It should also be appreciated that one or both of spring contacts 14 and 15 can be employed as heat sinks for other components in the voltage shifting circuitry 18.

This invention also provides for converting the voltage shifting circuitry 18 from one voltage output to a different voltage output. It will be observed in FIG. 5 that the circuit there depicted has two resistors 32 and 33 connected in parallel in locations from which they influence the output voltage of the circuit. With both resistors 32 and 33 connected in the circuit, the voltage output will have one value. With one of the resistors, say resistor 32, removed as indicated by the dotted line connections 34 in FIG. 5, the voltage output of the circuit will be different.

Figure 4:
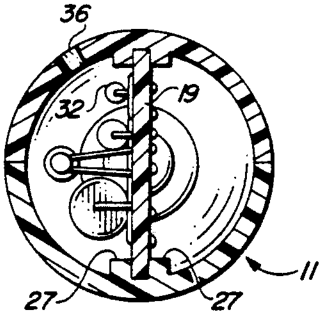
FIG. 4 is an enlarged sectional view taken generally as indicated by line 4—4 in FIG. 1.

As can be seen from FIGS. 1, 2, and 4, plug 11 has a small opening 36 in the wall of the handle 16 in the vicinity of resistor 32 on circuit board 19. By inserting a thin instrument through opening 36, it is possible to raise resistor 32 to break one of its connections to circuit board 19, thereby electrically removing it from the circuit while leaving resistor 33 in place.

From the foregoing, it should be apparent that this invention provides an improved voltage shifting plug for extracting electrical energy from a motor vehicle electrical system through the cigarette lighter receptacle.

What is claimed is:

1. A plug for extracting electrical energy from a cigarette lighter receptacle of a motor vehicle and for delivering electrical current at a voltage different from that available from the lighter receptacle, said plug comprising:

(a) a cylindrical body sized to fit snugly within the receptacle;

(b) a printed circuit board disposed within said cylindrical body;

(c) electronic components mounted on said printed circuit board within said cylindrical body for shifting the voltage of electrical current flowing therethrough;

(d) at least one of the electronic components on said printed circuit board generating heat within said cylindrical body when electrical current is flowing therethrough; and (e) a spring connector mounted on said printed circuit board within said cylindrical body and having a portion thereof extending externally of the cylindrical body for engagement with the receptacle, said connector extending in close proximity to said one electronic component for carrying heat away from said component to said receptacle.

2. The plug of claim 1, further characterized by having an opening to the interior thereof and a second electronic component disconnectably mounted on said printed circuit board in the vicinity of said opening whereby said second electronic component is accessible by and disconnectable form said printed circuit board by means of a tool inserted into the plug through said opening.

* * * * *